United States Patent [19]
Stephens

[11] 4,451,000
[45] May 29, 1984

[54] SOLDERING APPARATUS EXHAUST SYSTEM

[75] Inventor: David E. Stephens, Concord, Mass.

[73] Assignee: Hollis Engineering, Inc., Nashua, N.H.

[21] Appl. No.: 387,462

[22] Filed: Jun. 11, 1982

[51] Int. Cl.³ .............................................. H05K 3/34
[52] U.S. Cl. ...................................... 228/20; 228/57; 98/115 R; 156/63
[58] Field of Search ................. 228/20, 180 R, 180 A, 228/57; 156/61, 63; 98/115 R

[56] References Cited

U.S. PATENT DOCUMENTS

| | | | |
|---|---|---|---|
| 2,141,403 | 12/1938 | Offen | 98/115 R |
| 4,351,267 | 9/1982 | Kalbskopf et al. | 118/61 X |
| 4,401,253 | 8/1983 | O'Rourke | 228/125 |

OTHER PUBLICATIONS

"Insulation/Circuits"; vol. 27, No. 4, Apr. 1981 pp. 31-34.

Primary Examiner—Kenneth J. Ramsey
Attorney, Agent, or Firm—Hayes, Davis & Soloway

[57] ABSTRACT

The present invention provides an improvement in a circuit board mass soldering apparatus wherein a circuit board is contacted with molten solder at a soldering station and excess solder is removed from the surface of the board while still molten by impingement of a high velocity heated gas stream thereon, by providing a substantially horizontal louvered exhaust system adjacent to and in advance of the mass soldering station, below the travel path of the boards. The louvers extend and open into the path of the effluent gas stream such that the momentum of the gas stream carries it and entrained soldering fumes and particulates into the louvers to the underside thereof from which it may be exhausted by conventional means.

10 Claims, 6 Drawing Figures

SOLDERING APPARATUS EXHAUST SYSTEM

The present invention relates to systems for soldering electrical and electronic components onto substrate circuit boards, and more specifically to an improved apparatus for mass soldering electrical and electronic components by their leads, to printed circuit boards or the like.

BACKGROUND

Various soldering systems are well known in the art for mass soldering electrical and electronic components, by their leads, onto printed circuit boards. One technique for mass soldering components to circuit boards is that of dip soldering. With this technique, the entire side of a circuit board containing the printing wiring, with the leads from the components projecting through apertures in the board, is engaged for a certain period of time with the surface of a bath of molten solder, and then removed. Another technique for mass soldering components onto circuit boards is that of wave soldering. A typical prior art wave soldering system generally comprises a container adapted to hold a supply of molten solder and a sump partially submerged in the molten solder. The sump has an intake orifice below the surface of molten solder, and an elongate horizontal nozzle or slot above the surface of the solder. A positive displacement pump is submerged in the body of solder and is adapted to force molten solder into the sump intake orifice, where the molten solder than flows upward in the sump and out the horizontal nozzle to thereby produce a smoothly rounded standing wave of molten solder above the nozzle. Other techniques for mass soldering electrical and electronic components onto printed circuit boards well known in the art include cascade soldering, jet soldering and drag soldering. So-called "leadless" components such as flat packs also can be mass soldered to circuit boards by fixing the components to the bottom of a board, e.g. as by fixturing or with an adhesive, and then engaging the bottom of the board and the components with molten solder. While known mass soldering systems have provided substantial manufacturing economy to the electronics industry and thus achieved substantial commercial use, the deposition of excess solder on the board circuits, connections and leads has been a problem. Deposition of excess solder may result in formation of shorts, icicles and/or bridges, and increases solder consumption and finished board weight. Moreover, current trends in the electronics industry to relatively high density electronic assemblies has increased the problem of solder shorts, icicling and bridging.

The prior art has devised various techniques to solve the problems of solder shorts, icicling and bridging. For example, for wave soldering, one technique which has become virtually universally adopted by the industry is to incline the travel path of the circuit boards through the solder wave, i.e. from the horizontal, to increase the exit angle between a board being soldered and the solder wave. The art has also devised various wave geometries for further increasing the exit angle and/or changing the point where a circuit board exits the wave. Another system for reducing the incidence of solder shorts, icicling and bridging, which has achieved substantial commercial acceptance, is to intimately mix soldering oil in the solder wave in accordance with the teachings of Walker et al. U.S. Pat. No. 3,058,441. A more recent development in mass soldering systems and which has been found to eliminate substantially the incidence of solder shorts, bridging and/or icicling, is described in Canadian Pat. No. 1091102, Canadian Pat. No. 1096241, and the corresponding U.S. patent application of Harold T. O'Rourke, Ser. No. 897,492, filed Apr. 18, 1978, for Mass Soldering System (now abandoned), all assigned to the assignee of the present application. The aforesaid Canadian Patents and corresponding U.S. application disclose a mass soldering system wherein after the board has been contacted with the molten solder, excess solder deposited by the soldering process is removed by impinging a stream of heated gas onto the freshly deposited solder before it solidifies on the board. In practice, the stream of heated gas is directed onto the underside of the board from one or more fluid jets, fluid lenses, slots, nozzles or the like located immediately downstream of the mass soldering station and directed at a relatively acute angle (30° to 60°) to the underside surface of the board. In order to minimize escape of hot gas, soldering fumes and particulates an exhaust hood is provided over the solder bath, and the hood is gated so as to frustrate the flow of hot gas, soldering fumes and particulates under and beyond the upper exhaust hood. While gating the hood advantageously minimizes the escape of hot gas, soldering fumes and particulates, gating reduces product throughput by dictating conveyor spacing.

It is thus a primary object of the present invention to provide a mass soldering apparatus which overcomes the aforesaid disadvantages of the prior art.

Another object of the present invention is to minimize or eliminate the escape of soldering fumes and particulates from a mass soldering system in which freshly soldered boards are contacted by a stream of heated gas immediately following soldering.

Still other objects will in part appear obvious and in part will appear hereinafter.

The invention accordingly comprises the apparatus possessing the features, properties and relations of elements which are exemplified in the following detailed description and the scope of the application of which will be indicated in the claims.

THE INVENTION

The present invention overcomes the foregoing and other problems of the prior art by providing an exhaust system below the path of travel of the circuit boards substantially immediately upstream of the mass soldering station. It has been observed that the gas stream flow while not laminar is substantially so as it flows past the mass soldering station solder bath or solder wave and, due to the Coanda effect, is relatively horizontal, and in part downwardly directed somewhat by having "attached itself" to the wave surface. Accordingly, in the present invention, an exhaust system having a substantially horizontal louvered surface is provided below the path of travel of the circuit boards, immediately upstream of the soldering station, with the louvers facing and opening into the heated gas stream. The louvers pick up the gas stream which is still at a relatively high velocity, capturing the kinetic energy of the stream, and using the kinetic energy of the stream to assist in the exhaust process so that little additional energy is required to pull the air stream and entrained fumes and particulates into the exhaust system. In this way, a substantial portion of the horizontal component of the gas stream may be captured using the gas stream momentum to aid in its removal and the removal of entrained soldering fumes and particulates, without the need to gate the upper exhaust hood as has been the case in the past.

In the following description a mass wave soldering base is used to illustrate the mass soldering station. However, one skilled in the art will recognize that similar advantages may be achieved in conjunction with other types of mass soldering stations such as cascade, jet and drag soldering systems.

More particularly the present invention provides an improvement in a circuit board mass soldering apparatus wherein a circuit board is contacted with molten solder at a soldering station and excess solder is removed from the surface of the board while still molten by impingement of a high velocity heated gas stream thereon, by providing a substantially horizontal louvered exhaust system adjacent to and in advance of the mass soldering station, below the travel path of the boards. The louvers extend and open into the path of the effluent gas stream such that the momentum of the gas stream carries it and entrained soldering fumes and particulates into the louvers to the underside thereof from which it may be exhausted by conventional means. The combination of the upper and lower exhaust system assures of substantially 100% capture and removal of the hot gas stream, entrained fumes and particulates from the mass soldering apparatus, without gating the upper hood.

For a fuller understanding of the objects of the present invention, reference should be had to the following detailed description taken in connection with the accompanying drawings in which.

In the following detailed description of the present invention, the term "component" refers to so-called leadless components such as chip components as well as components having conventional metallic conductors or leads. The term "component lead" refers to that part of metallic conductor of an electrical or electronic component that is joined to the printed circuit board pattern, i.e. the component leads, terminals, lugs, pins, etc. The term "land" as used herein refers to that part of the metallic pattern on the printed circuit board to which a component or component lead is joined by solder. The term "gas" is to be understood to refer to a gas or mixture of gases. If desired, the gas or mixture of gases may also contain liquid droplets dispersed therein. The term "mass soldering" as used herein is intended to refer to any of the several soldering techniques known in the art in which solder is applied to a circuit board from a reservoir of liquid solder, including, by way of example but not limitation: wave soldering, pot soldering, jet soldering, cascade soldering and drag soldering.

Figure 1:
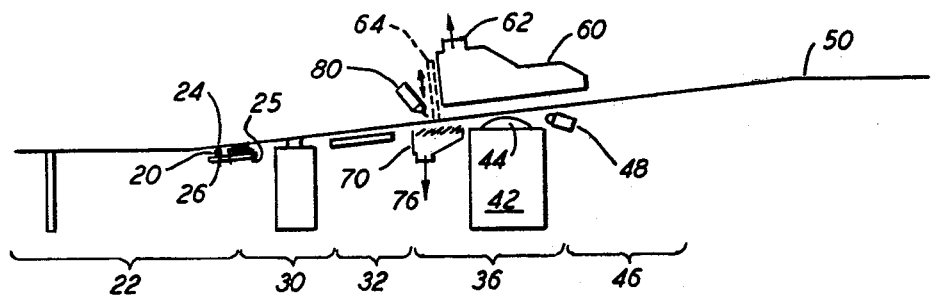
FIG. 1 is a side elevational view, diagrammatically illustrating a mass soldering system according to the present invention.

Referring now to the accompanying drawings, a preferred embodiment of the present invention will be described in combination with a wave soldering system. Referring first to FIG. 1, a printed circuit board 20 is loaded at an insertion station 22, with a plurality of electrical or electronic components 24 at predetermined positions on the board. The board comprises an insulated wiring board having one or more printed metallic conductors on the board underside, and a plurality of apertures 25 which extend through the board. Components 24 are loaded onto the top side of the board with their leads 26 protruding downward through the board apertures 25 in juxtaposition to the circuit lands to which they are to be joined. The components may be inserted in the board by any method known in the art which may include manual assembly, semi-automatic, or automatic assembly which may comprise single-station of multiple-station pantagraph or numerically controlled machines all of which are well known in the art and need not be described further.

The next step involves treating the surfaces to be soldered with a so-called flux at a fluxing station 30. The flux may be any flux well known in the art and may include, for example, a water-white rosin flux, an activated rosin flux or a water soluble flux. The flux may be applied in fluxing station 30 by any manner well known in the art, for example, by spraying, foaming, brushing, or from a flux wave.

The board is then passed from fluxing station 30 to a preheating station 32 where the board is preheated to mobilize the flux and also drive off the bulk of the flux solvent to form an active flux layer on the boards and leads. Preheating station 32 may comprise infrared or convection heaters or a combination of infrared and convection heaters as are well known in the art.

Figure 2:
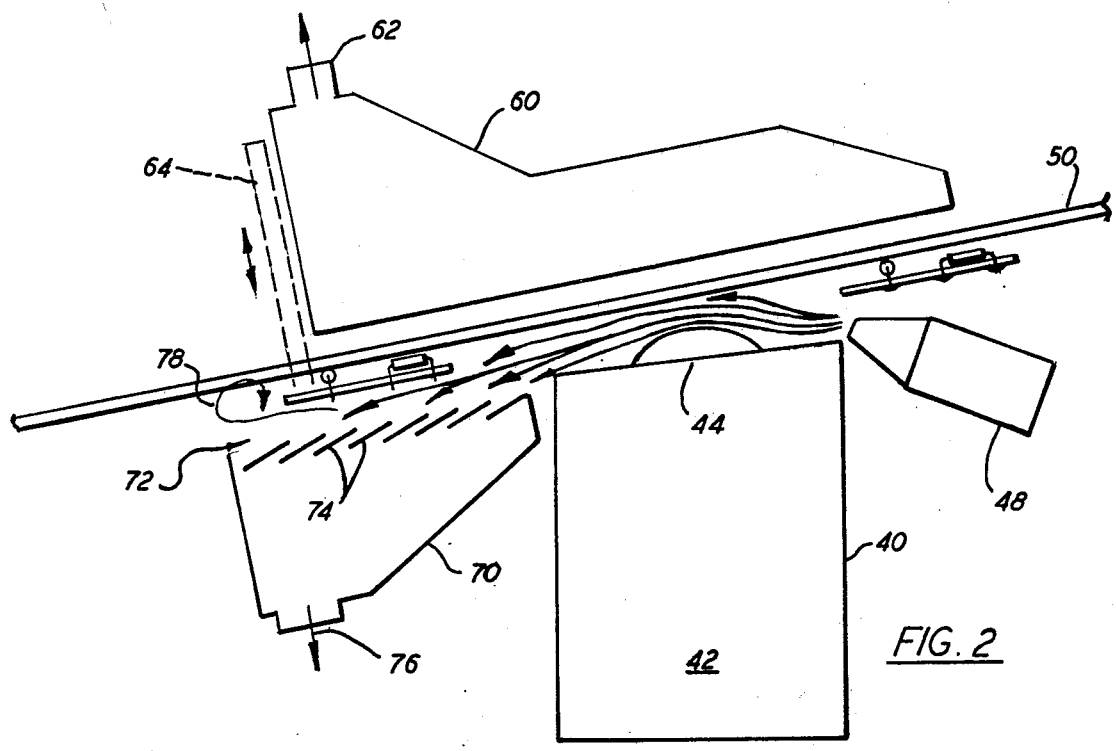
FIG. 2 is a side elevational view, partly in section, of the soldering station and exhaust system portion of the soldering system of FIG. 1.
Figure 4:
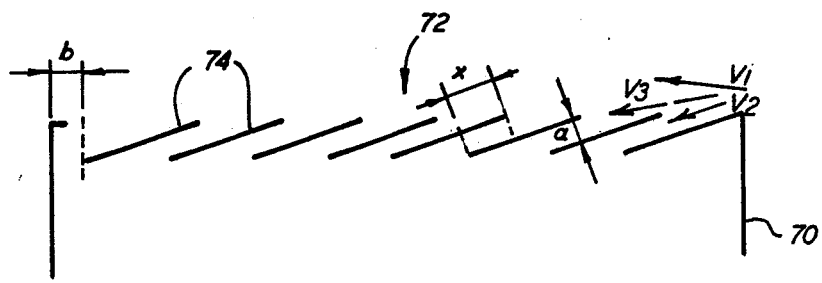
FIG. 4 is a side elevational view showing certain details of the exhaust system of FIG. 3.
Figure 3:
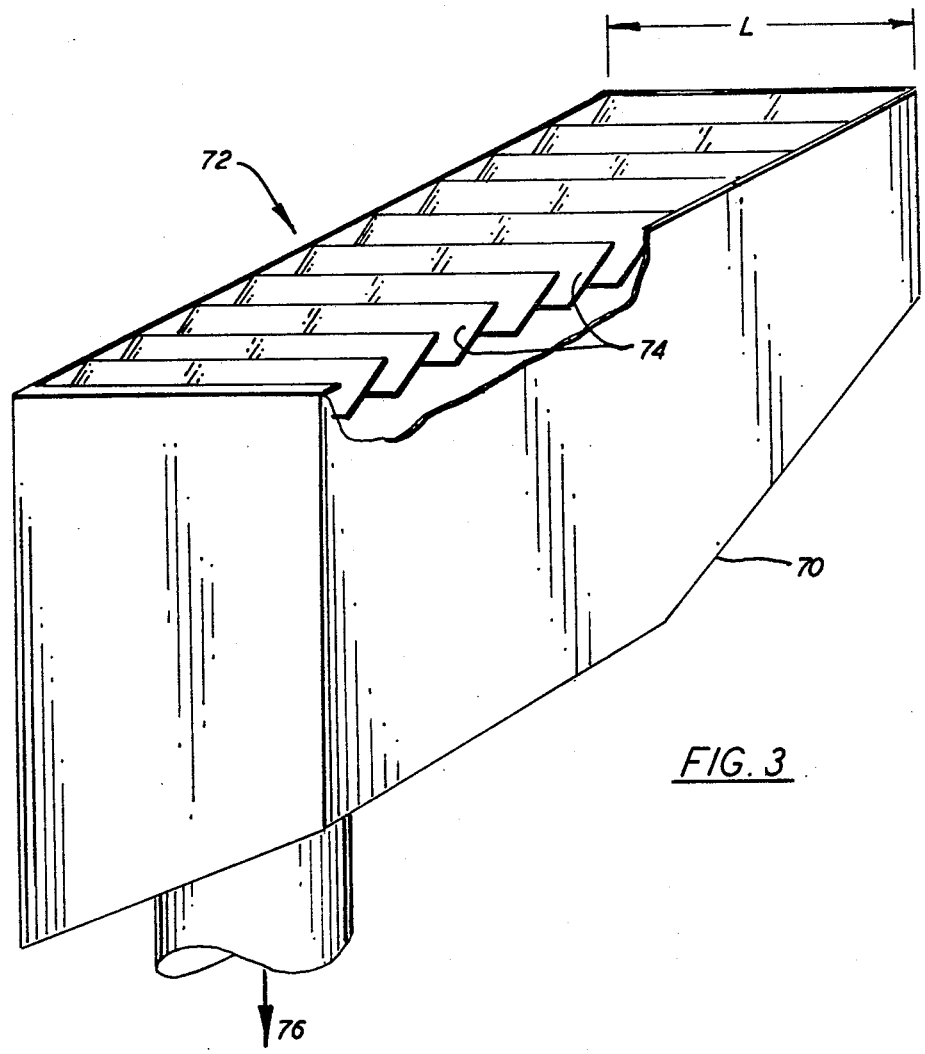
FIG. 3 is a side perspective view, partly in section, of the lower exhaust system portion of FIG. 2.

The fluxed preheated board is then passed to a mass wave soldering station 36. Referring also to FIG. 2 mass wave soldering station 36 includes a container of conventional design, indicated generally at 40, for holding a supply of molten solder 42. Conventional heating means (not shown) may be secured to the bottom and-/or side walls of container 40 or immersed in the solder to heat and maintain the supply of solder 42 in molten condition. Completing the soldering station is a variable speed pump (not shown) for pumping solder in known manner as a standing solder wave indicated generally at 44.

Immediately following soldering station 36 is an excess solder removal station 46. Excess solder removal station 46 follows mass wave soldering station 36 immediately in-line and is designated to relocate or blow off excess solder from the board underside before the solder solidifies as shorts, icicles and/or bridges. Solder removal station 46 comprises one or more fluid jets, fluid knives, slots, nozzles or the like indicated generally at 48, from which a heated gas stream can be directed onto the underside of the board, i.e. in accordance with the teachings of Canadian Pat. Nos. 1091102 and 1096241. Gas flow rate, gas pressure, and gas temperature and the time elapsed between circuit board emersion from the solder wave and beginning of contact by the heated gas stream may vary widely depending on the board temperature, ambient temperature, melting point of the solder, specific heat of fluid and heat transfer coefficient of fluid to the board, board size and shape, component density, amount of solder deposited and to be removed, conveyor speed, and distance between the soldering station and the excess solder removal station. Nozzles 48 of course must be spaced sufficiently below the path of travel of the boards to permit clearance of the longest depending lead, etc. Inert gas may be used as the gas, but preferably the impinging gas comprises heated air. Preferably the air is pre-heated to a temperature in the range of about 93° C. to 350° C., preferably about 290° C. to 300° C. (measured at the outlet of nozzle 48). For 63/37 solder alloy, the preferred preheat temperature is about 290° C. (measured by the outlet of nozzle 48).

The hot air stream impinging on still molten solder contained on the underside of the circuit board, the interconnections and the component leads and/or bodies relocates excess solder on, and/or blasts excess solder from the underside of the board, interconnections, leads, and bodies, and in doing so also minimizes the possibility of solder bridging or icicling or short formation upon solidification.

Also included in the soldering system is a circuit board conveyor 50 of conventional construction. The latter comprises a pair of spaced conveyor rails and suitable drive means (not shown) for carrying a circuit board from insertion station 22 through fluxing station 30, preheating station 32, wave soldering station 36, and solder removal station 46.

As in the past, a large hood or exhaust system 60 is placed over the soldering station 36 and solder removal station 46. Gases collected under the hood are removed from the hood at 62 by using a fan or such other powered exhaust means as are conventional. As seen particularly in FIG. 2 due to the Coanda effect the air stream issuing from nozzle 48 is deflected after it leaves the nozzle and attaches itself to the wave surface with the result that the air stream in large part flows substantially horizontal and is, in part, downwardly directed. In the past, a gate 64 (shown in phantom) has been used to enhance collecting action of the hood by deflecting the horizontal component of the air stream. The gate 64 raises and lowers as each successive circuit board enters the system. Notwithstanding the provision of gate 64, it has proved to be difficult to get the high velocity effluent gases to make a radical (90°) turn into the upper hood 60.

This invention overcomes the aforesaid problem by the provision of a lower exhaust system 70 having a generally horizontal louvered collection surface generally indicated at 72. Lower exhaust system 70 is positioned inline, immediately upstream of mass soldering station 36, below the path of travel of the boards being soldered, and preferably has a horizontal width which exceeds the width of the gas stream issuing from nozzle 48 by at least about 16%. Of course, louvered collection surface 72 must be placed sufficiently below the path of travel of the boards to permit clearance of the longest depending lead, etc. The louvers 74 of louvered surface 72 extend upwardly at an acute angle to the horizontal and open into the path of the horizontal component of the air stream issuing from nozzle 48. This air stream and entrained soldering fumes and particulates still have a relatively high velocity or momentum when they reach the louvered surface 72. As will be described hereinafter, louvers 74 scoop the air stream and entrained soldering fumes and particulates, deflecting them slightly downward into the lower exhaust system 70 so that little additional energy is required to pull the air stream and entrained fumes and particulates into the lower exhaust system. Most usually the flow of the air stream and entrained soldering fumes and particulates can be considered to be substantially horizontal or slightly downward deflected as it enters the area of the louvered exhaust surface 72. While not totally laminar at this point, the flow of air stream and entrained soldering fumes and particulates is substantially so with the result that by suitable configuration louvered surface 72 will not unduly disrupt this laminar flow and will permit the momentum of the air stream and entrained soldering fumes and particulates to flow into the lower exhaust system 70 with as much efficiency as possible.

A feature and advantage of the present invention is to match the exhaust vector ($V_2$) of louvered exhaust surface 72 to the flow vector ($V_1$) of the air stream being exhausted whereby to impart an entrance vector sum ($V_3$) which is approximately equal to, and preferably greater than flow vector ($V_1$). Given a louvered exhaust surface 72 having louvers 74 of length "L", an overlap "x" between pairs of louvers, an opening spacing "a" between pairs of louvers, and a louvered surface end space opening "b", as $(\epsilon a + b)L \rightarrow 0$ for a given exhaust rate (R), exhaust vector ($V_2$) increases according to the following equation:

$$V_2 = \frac{R}{L(\epsilon a + b)} = (ft/min)$$

Where
R = gas flow expressed in cubic feet per minute
$(\epsilon a + b)L = ft^2$, and
L = length of the individual louver blades in feet.

It is thus seen that the ratio of "a" to "x" for a given L, can be adjusted to produce an entrance vector ($V_3$) for maximum trapping of the gas stream. Thus the adjustment of "x" (louver overlap) should be such as to create a flow vector ($V_1$) that is substantially parallel to exhaust vector ($V_2$) and to the louvered surface 72. By way of example, for trapping a 2 inch by 2 ft wide hot air stream having a velocity (average) of 160 fpm, issuing from a nozzle 48 which is angled at 15° to the horizontal, using a lower louver surface 72 of dimensions 2.3 ft by 1 ft, and having 4 louvers 74 of 2.3 ft length each, louver overlap ("x") should be adjusted so that the opening between the individual louvers "a" is 0.021 ft, and the louver end space opening "b" is 0.063 ft and "x" is 0.084 ft.

The collected air and entrained fumes and particulates are removed from lower exhaust chamber 70 at exhaust port 76. As is the case with the upper hood 60, a fan or other powered exhaust means is used to enhance the flow of the gases in chamber 70 by imparting a negative pressure on the underside of surface of 72. If this negative pressure is sufficiently high, it will, of course, serve also to draw gases down into the louvered exhaust surface 72 including those that might otherwise escape past the exhaust surface as indicated at 78. The collected air may then be filtered and recycled to the solder removal station, passed to the preheating station 32, or vented to the atmosphere.

Preferably exhaust chamber 70 is configured and the exhaust port 76 is located as to provide substantially uniform negative pressure along the underside of louvered exhaust surface 72.

Figure 5:
FIG. 5 is a view similar to FIG. 4, and showing details of a modification of the exhaust system of FIG. 3.
Figure 6:
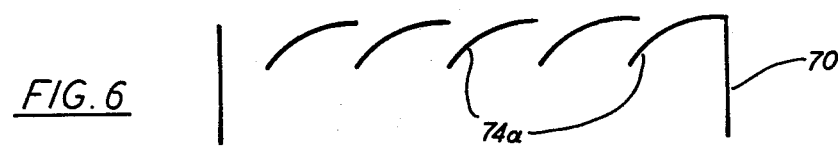
FIG. 6 is a view similar to FIG. 4, and showing details of yet another modification of the exhaust system of FIG. 4.

Various changes may be made in the foregoing invention without department from the inventive features described herein. For example, collection action of the lower exhaust system may be enhanced by providing a downwardly directed air knife 80, or the like, upstream of the lower exhaust chamber 72 for directing an air stream into lowered exhaust surface 72 (see FIG. 1). Typically, a relatively low pressure air stream will be sufficient to discourage escape of gases at this point. The collection action of the lower exhaust system may be further enhanced by "tuning" louvered surface 72, by adjusting the respective angles and widths of individual louvers 74 thus changing the overlaps "x" and opening spacings "a" between pairs of louvers (see FIG. 5). Also, the louvers may be curved in cross section as shown at 74a in FIG. 6. Moreover, the collection action of the lower exhaust system of the present invention has been found to be so effective that the upper exhaust system 60 may be eliminated for certain applications. At the very least the energy requirements for the upper exhaust system 60 may be substantially reduced by the provision of the lower exhaust system in accordance with the present invention. Still other changes will be obvious to one skilled in the art. Accordingly, it is intended that all matter contained in the above description or shown in the accompanying drawings shall be interpreted in an illustrative and not in a limiting sense.

What is claimed is:

1. In apparatus for mass joining with solder electrical and electronic components assembled in a circuit board and comprising in combination: a mass soldering station adapted to deposit a quantity of molten solder onto said board underside whereby to join said board and said components; an excess solder removal station adjacent and downstream of said soldering station, said excess solder removal station comprising at least one gas jet disposed below the travel path of said board and adapted to direct a fluid gas stream onto the freshly deposited solder on said board underside, a source of pressurized fluid, and means connecting said source and said at least one fluid jet; said excess solder removal station being adapted to relocate or remove a portion of the molten solder deposited on said board before said molten solder solidifies; and means for transporting said circuit board in line-through said mass soldering station, and said excess solder removal station; the improvement which comprises a louvered exhaust system adjacent and upstream of said soldering station, said louvered exhaust system having a generally horizontal louvered surface located below the path of said circuit board, the louvers of which extend and open into the path of said gas stream, and including exhaust means for removing gases from the underside of said louvered surface.

2. In apparatus according to claim 1, the improvement wherein said gas stream has a substantial horizontal width, and said louvered surface has a horizontal width which exceeds said gas stream horizontal width by at least about 16%.

3. In apparatus according to claim 1, the improvement wherein the angle of said louvers is adjustable.

4. In apparatus of any one of claims 1 to 3, and further including an upper exhaust system extending at least in part over said generally horizontal louvered surface, said mass soldering device and solder removal station, said upper exhaust system having second exhaust means for exhausting gases therefrom.

5. In apparatus according to claim 4, and further including at least one gas jet disposed above travel path of said board upstream of said generally horizontal louvered surface, and adapted to direct a fluid gas stream onto said generally horizontal louvered surface.

6. Apparatus for mass joining with solder electrical and electronic components assembled in a circuit board and comprising in combination:
a mass soldering station adapted to deposit a quantity of molten solder onto said board underside whereby to join said board and said components;
an excess solder removal station adjacent and downstream of said soldering station, said excess solder removal station comprising at least one gas jet disposed below the travel path of said board and adapted to direct a fluid gas stream onto the freshly deposited solder on said board underside, a source of pressurized fluid, and means connecting said source and said at least one fluid jet, said excess solder removal station being adapted to relocate or remove a portion of the molten solder deposited on said board before said molten solder solidifies;
a louvered exhaust system adjacent and upstream of said soldering station, said louvered exhaust system having a generally horizontal louvered surface located below the path of said circuit board, the louvers of which extend and open into the path of said gas stream, and including exhaust means for removing gases from the underside of said louvered surface; and
means for transporting said circuit board in line-through said mass soldering station, and said excess solder removal station.

7. Apparatus according to claim 6, wherein said gas stream has a substantial horizontal width, and said louvered surface has a horizontal width which exceeds said gas stream horizontal width by at least about 16%.

8. Apparatus according to claim 1, wherein the angle of said louvers is adjustable.

9. Apparatus of any one of claims 6 to 8, and further including an upper exhaust system extending at least in part over said generally horizontal louvered surface, said mass soldering device and solder removal station, said upper exhaust system having second exhaust means for exhausting gases therefrom.

10. Apparatus according to claim 9, and further including at least one gas jet disposed above travel path of said board upstream of said generally horizontal louvered surface, and adapted to direct a fluid gas stream onto said generally horizontal louvered surface.

* * * * *